United States Patent
Nichols et al.

(10) Patent No.: US 8,469,744 B2
(45) Date of Patent: Jun. 25, 2013

(54) ELECTRICAL CONNECTOR ASSEMBLY HAVING AIRFLOW CHANNELS

(75) Inventors: Robert Paul Nichols, Santa Rosa, CA (US); David A. Dedonato, Hopedale, MA (US); Matthew Ryan Schmitt, Middletown, PA (US); Richard James Long, Columbia, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 345 days.

(21) Appl. No.: 13/016,411

(22) Filed: Jan. 28, 2011

(65) Prior Publication Data

US 2012/0196477 A1 Aug. 2, 2012

(51) Int. Cl.
*H01R 13/648* (2006.01)

(52) U.S. Cl.
USPC ............................................ 439/607.01

(58) Field of Classification Search
USPC ............ 439/607.01, 607.25, 607.17, 607.18, 439/607.21, 939, 108, 541.5, 138, 752, 79, 439/676
See application file for complete search history.

(56) References Cited

U.S. PATENT DOCUMENTS

| | | | |
|---|---|---|---|
| 6,972,968 B2 * | 12/2005 | Hwang | 361/818 |
| 7,070,446 B2 | 7/2006 | Henry et al. | |
| 7,704,097 B1 | 4/2010 | Phillips et al. | |
| 8,123,559 B2 * | 2/2012 | Brown et al. | 439/607.21 |
| 8,277,252 B2 * | 10/2012 | Fogg et al. | 439/607.25 |
| 2010/0111476 A1 | 5/2010 | Shirk et al. | |

FOREIGN PATENT DOCUMENTS

WO 2010104847 9/2010

* cited by examiner

*Primary Examiner* — Edwin A. Leon

(57) ABSTRACT

An electrical connector assembly includes a shielding cage member having a plurality of walls including a top wall, a lower wall, a rear wall and side walls. The walls define an upper port and a lower port configured to receive pluggable modules therein. The cage member has openings in a front thereof for receiving the pluggable modules. The side walls include airflow openings on opposite sides of the cage member. A receptacle connector is received in the cage member proximate to the rear and is accessible through the upper port and the lower port. A separator member extends between the upper and lower ports that have an upper plate and a lower plate with a channel therebetween. The airflow openings are aligned with the channel and provide airflow through the channel. EMI screens cover the airflow openings to limit EMI passage through the airflow openings.

20 Claims, 9 Drawing Sheets

ELECTRICAL CONNECTOR ASSEMBLY HAVING AIRFLOW CHANNELS

BACKGROUND OF THE INVENTION

The subject matter herein relates generally to electronic connector assemblies and, more specifically, to connector systems for pluggable electronic modules, such as transceiver modules, for high speed fiber optical and copper communications.

It is known to provide a metal cage with a plurality of ports, whereby transceiver modules are pluggable therein. Several pluggable module designs and standards have been introduced in which a pluggable module plugs into a receptacle which is electronically connected to a host circuit board. For example, a well-known type of transceiver developed by an industry consortium is known as a gigabit interface converter (GBIC) or serial optical converter (SOC) and provides an interface between a computer and a data communication network such as Ethernet or a fiber network. These standards offer a generally robust design which has been well received in industry.

It is desirable to increase the port density associated with the network connection, such as, for example, switch boxes, cabling patch panels, wiring closets, and computer I/O. Recently, a new standard has been promulgated and is referred to herein as the small form factor pluggable (SFP) standard which specifies an enclosure height of 9.8 mm and a width of 13.5 mm and a minimum of 20 electrical input/output connections.

It is also desirable to increase the operating frequency of the network connection. For example, applications are quickly moving to the multi-gigabit realm. Electrical connector systems that are used at increased operating speeds present a number of design problems, particularly in applications in which data transmission rates are high, e.g., in the range above 10 Gbs (Gigabits/second). Of particular concern is reducing electromagnetic interference (EMI) emissions. Due to FCC regulations, there is a need not only to minimize the EMI emissions of the module, but also to contain the EMI emissions of the host system in which the module is mounted regardless of whether a module is plugged in to the receptacle.

In conventional designs, EMI shielding is achieved by using a shielded metal cage surrounding the receptacles. However, as the speeds of the network connections increase, the EMI shielding provided by conventional cages are proving to be inadequate. Therefore, there is a need for a connection system design that conforms to the SFP standard while minimizing EMI emissions.

BRIEF DESCRIPTION OF THE INVENTION

In one embodiment, an electrical connector assembly is provided with a shielding cage member having a plurality of walls including a top wall, a lower wall, a rear wall and side walls. The walls define an upper port and a lower port configured to receive pluggable modules therein. The cage member has openings in a front thereof for receiving the pluggable modules. A separator member extends between the upper and lower ports and has an upper plate and a lower plate with a channel therebetween. A receptacle connector is received in the cage member proximate to the rear that is accessible through the upper port and the lower port. The side walls include airflow openings on opposite sides of the cage member. The airflow openings are aligned with the channel and provide airflow through the channel.

In another embodiment, an electrical connector assembly is provided with a shielding cage member having a plurality of walls including a top wall, a lower wall, a rear wall and side walls. The walls define an upper port and a lower port configured to receive pluggable modules therein. The cage member has openings in a front thereof for receiving the pluggable modules. The side walls include airflow openings on opposite sides of the cage member. A receptacle connector is received in the cage member proximate to the rear and is accessible through the upper port and the lower port. A separator member extends between the upper and lower ports that have an upper plate and a lower plate with a channel therebetween. The airflow openings are aligned with the channel and provide airflow through the channel. EMI screens cover the airflow openings to limit EMI passage through the airflow openings.

In a further embodiment, an electrical connector assembly is provided with a shielding cage member having an upper port and a lower port configured to receive pluggable modules therein. The cage member has a front mating face that has openings that receive the pluggable modules. The cage member has outer side walls along the sides of the upper and lower ports and a separator member extending between the upper and lower ports. The separator member has an upper plate and a lower plate with a channel therebetween. The outer side walls have airflow openings on opposite sides of the cage member. The airflow openings are aligned with the channel and provide airflow through the channel.

DETAILED DESCRIPTION OF THE INVENTION

Figure 1:
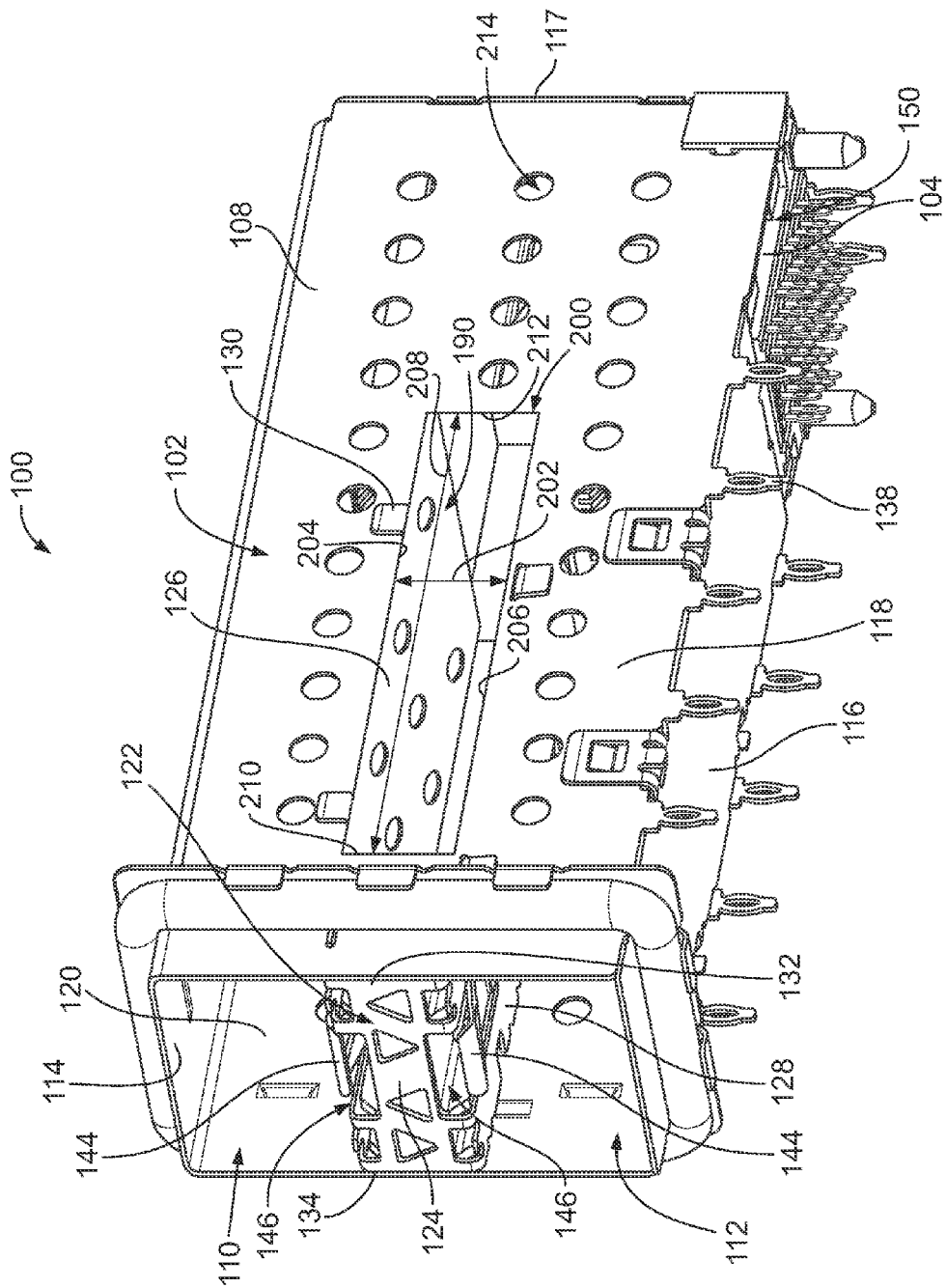
FIG. 1 is a front perspective view of an electrical connector assembly formed in accordance with an exemplary embodiment showing a cage member and a receptacle connector.

FIG. 1 is a front perspective view of an electrical connector assembly 100 formed in accordance with an exemplary embodiment. The electrical connector assembly 100 includes a cage member 102 and a receptacle connector 104 received in the cage member 102. Pluggable modules 106 (shown in FIG. 9) are configured to be loaded into the cage member 102 for mating with the receptacle connector 104. The receptacle connector 104 is intended for placement on a circuit board, such as a motherboard, and is arranged within the cage member 102 for mating engagement with the pluggable modules 106.

The cage member 102 is a shielded, stamped and formed cage member that includes a plurality of shielded walls 108 that define multiple ports 110, 112 for receipt of the pluggable modules 106. The port 110 defines an upper port positioned above the port 112 and may be referred to hereinafter as upper port 110. The port 112 defines a lower port positioned above the port 110 and may be referred to hereinafter as lower port 112. Any number of ports may be provided in alternative embodiments. In the illustrated embodiment, the cage member 102 includes the ports 110, 112 arranged in a single column, however, the cage member 102 may include multiple columns of ports 110, 112 in alternative embodiments.

The cage member 102 includes a top wall 114, a lower wall 116, a rear wall 117 and side walls 118, 120, which together define the general enclosure for the cage member 102. The cage member 102 is subdivided by a center separator member 122 to define the upper and lower ports 110, 112. The separator member 122 extends between the side walls 118, 120. The separator member 122 has a front wall 124 with an upper plate 126 and a lower plate 128 extending rearward from the front wall 124. A channel 190 is defined between the upper and lower plates 126, 128 rearward of the front wall 124. The upper and lower plates 126, 128 are spaced apart from one another defining an air gap through the channel 190. In an exemplary embodiment, airflow openings 200 are provided in the side walls 118, 120 to provide access to the channel 190. The airflow openings 200 are large openings in the side walls 118, 120 providing a large volume of air flow through the channel 190. In the illustrated embodiment, the airflow openings 200 are substantially similar in size as the channel 190.

In an exemplary embodiment, the airflow openings 200 have a height 202 measured between an upper edge 204 and a lower edge 206 that is substantially equal to a height of the channel 190. The upper edge 204 is aligned with the upper plate 126 and the lower edge 206 is aligned with the lower plate 128. In an exemplary embodiment, the airflow openings 200 have a length 208 measured between a front edge 210 and a rear edge 212 that is substantially equal to a length of the channel 190. The front edge 210 is positioned proximate to the front wall 124 and the rear edge 212 is positioned proximate to a rear end of the upper and lower plates 126, 128. The airflow openings 200 define high airflow openings allowing a high volume of airflow. In an exemplary embodiment, the walls 108 of the cage member 102 include a plurality of low airflow openings 214 dispersed about the cage member 102. The low airflow openings 214 are relatively small compared to the airflow openings 200. The low airflow openings 214 are circular in shape and may be aligned with the upper port 110, the lower port 112, the receptacle connector 104 and/or the channel 190. The low airflow openings 214 are circular in shape and are sufficiently small to limit EMI leakage therethrough.

The separator member 122 is retained in place by tabs 130, which extend from side edges 132, 134 of the upper and lower plates 126, 128, and which extend through the side walls 118, 120.

The cage member 102 has numerous features allowing the grounding of the cage member 102 to a motherboard and/or a further panel. The lower wall 116 and side walls 118, 120 include tines 138 extending therefrom that are configured to be received in plated ground vias of the motherboard to electrically ground the cage member 102 to the ground plane of the motherboard. The tines 138 are profiled to both mechanically hold the cage member 102 to the motherboard as well as to ground the cage member 102 thereto. Similar features may extend from the lower wall 116 and provide grounding of the cage member 102 to the motherboard. Around the perimeter of the cage member 102 towards the front edge thereof, the cage member 102 may include a plurality of resilient tabs, which are profiled to engage an edge of an opening through which the cage member 102 is inserted, such as an opening in a panel or chassis.

The separator member 122 includes latches 144 adjacent a front edge thereof for grounding the pluggable module 106 and the cage member 102. Additionally, the latches 144 have latch openings 146 for latching engagement with the pluggable module 106. The latches 144 are deflectable and are stamped from the upper and lower plates 126, 128.

The lower wall 116 includes an opening 150 therethrough. The receptacle connector 104 is received in the opening 150. The receptacle connector 104 is accessible through the lower port 112 and the upper port 110. The separator member 122 does not extend to the rear wall 117, but rather stops short of the rear wall 117 to provide a space for the receptacle connector 104 to be loaded into the upper port 110.

Figure 2:
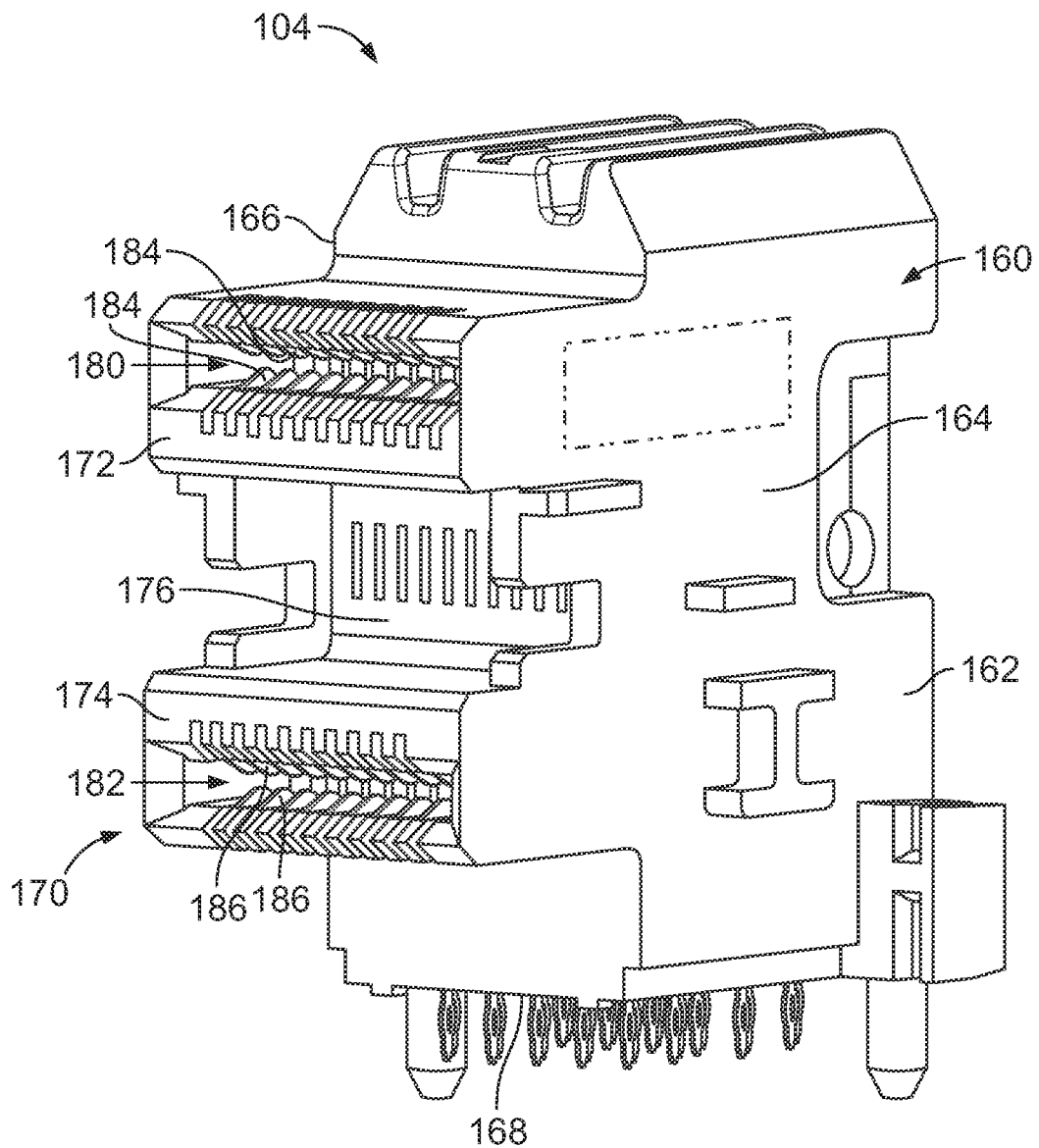
FIG. 2 is a front perspective view of one of the receptacle connectors shown in FIG. 1.

FIG. 2 is a front perspective view of the receptacle connector 104. The receptacle connector 104 includes a housing 160 defined by an upstanding body portion 162 having side walls 164, 166, a lower face 168 configured to be mounted to the motherboard, and a mating face 170. Upper and lower extension portions 172 and 174 extend from the body portion 162 to define the mating face 170. A recessed face 176 is defined between the upper and lower extensions 172, 174 at the front face of the body portion 162.

Circuit card receiving slots 180 and 182 extend inwardly from the mating face 170 of each of the respective upper and lower extensions 172, 174, and extend inwardly to the housing body 160. The circuit card receiving slots 180, 182 are configured to receive a card edge of the pluggable module 106 (shown in FIG. 9). A plurality of contacts 184 are held by the housing 160 and are exposed within the circuit card receiving slot 180 for mating with the corresponding pluggable module 106. The contacts 184 extend from the lower face 168 and are terminated to the motherboard. For example, the ends of the contacts 184 may constitute pins that are loaded into plated vias of the motherboard. Alternatively, the contacts 184 may be terminated to the motherboard in another manner, such as by surface mounting to the motherboard. A plurality of contacts 186 are held by the housing 160 and are exposed within the circuit card receiving slot 182 for mating with the corresponding pluggable module 106. The contacts 186 extend from the lower face 168 and are terminated to the motherboard.

Figure 3:
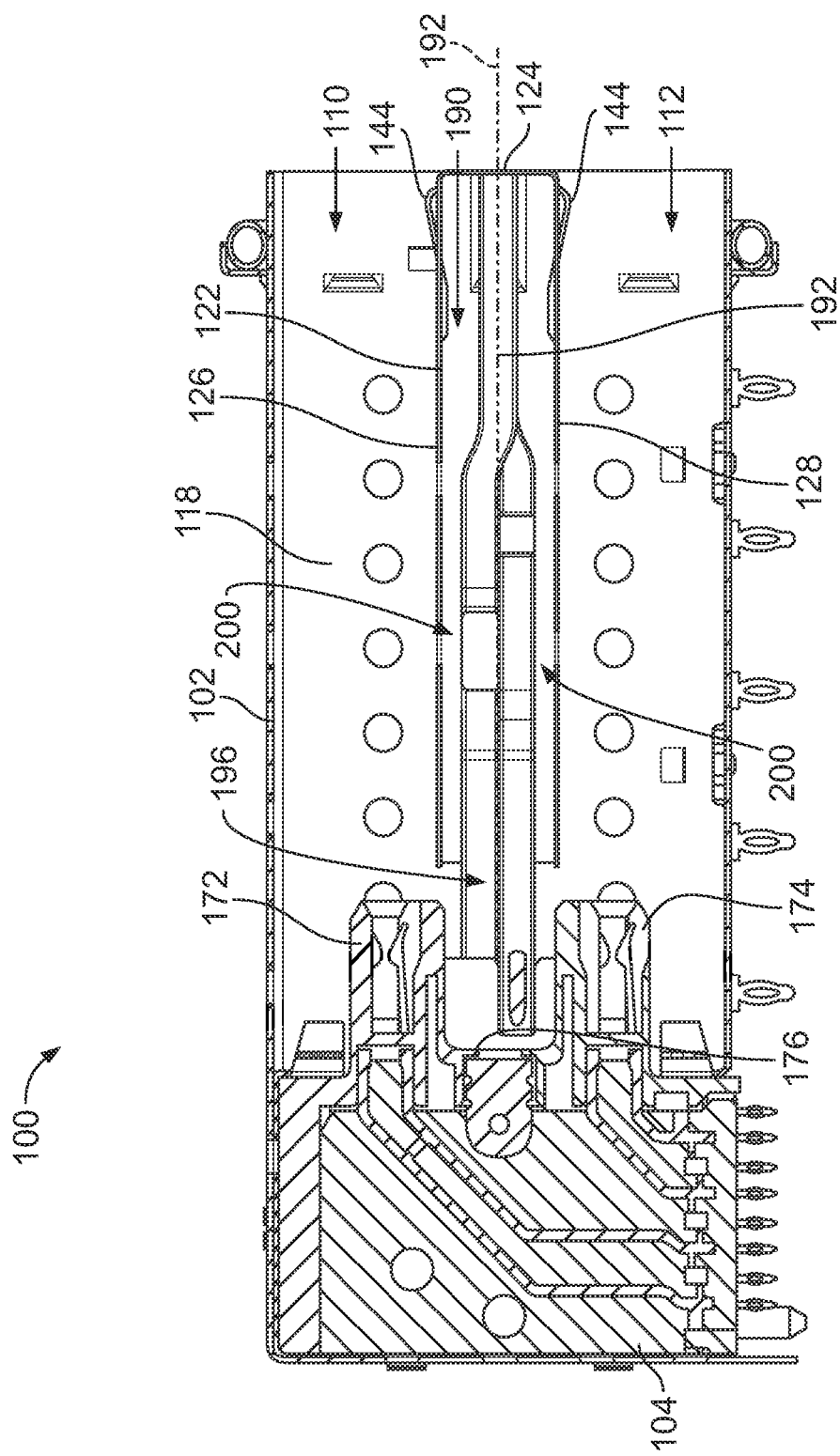
FIG. 3 is a side view of the electrical connector assembly.

FIG. 3 is a side view of the electrical connector assembly 100. The receptacle connector 104 is illustrated loaded into the cage member 102. The upper and lower extension portions 172 and 174 are aligned within the upper and lower ports 110, 112. The separator member 122 is aligned with the recessed face 176.

The separator member 122 includes the channel 190 between the upper and lower plates 126, 128. The airflow opening 200 in the side wall 118 is aligned with the channel 190 and allows a large volume of airflow through the channel 190. The channel 190 is elongated and extends along a longitudinal axis 192 generally from the receptacle connector 104 to the front wall 124. The channel 190 is open at the back end of the separator member 122. The channel 190 extends to the front wall 124. The latches 144 may be at least partially deflected into the channel 190 when the pluggable modules 106 (shown in FIG. 9) are loaded into the ports 110, 112. The channel 190 defines a space that allows the latches 144 and/or portions of the pluggable modules 106 to extend into during use. The upper and lower plates 126, 128 are spaced apart to accommodate the latches 144 and/or portions of the pluggable modules 106.

In an exemplary embodiment, the electrical connector assembly 100 includes a light pipe (LP) structure 196 that includes one or more light pipes. The light pipe structure 196 is routed through the channel 190 to the front wall 124. Gaps are provided between the light pipes and the upper and lower plates 126, 128. Air flow is allowed between the light pipe structure 196 and the upper and lower plates 126, 128. The air flow past the upper and lower plates 126, 128 cools the upper and lower plates 126, 128 from heat generated by the pluggable modules 106 (shown in FIG. 9) when received in the upper and lower ports 110, 112. The air flow helps to dissipate heat from the upper and lower plates 126, 128, and thus from the upper and lower ports 110, 112 and the pluggable modules 106 within the upper and lower ports 110, 112.

The light pipe structure 196 transmits light that may originate from light emitting diodes (LEDs) on the motherboard mounted proximate to the receptacle connector 104. The light is transmitted by the light pipe structure 196 from the LEDs to a remote location that is viewable or detectable by an operator. The light indicates a condition of the electrical and/or optical connection between the pluggable module 106 (shown in FIG. 9) and the receptacle connector 104. The condition may relate to a quality of transmission between the pluggable module 106 (shown in FIG. 9) and the receptacle connector 104. For example, the status indication may be a colored light (e.g., green for high quality transmission, red for poor transmission or to indicate a disconnection). The status indication may be a light that flashes or blinks at a predetermined frequency.

Optionally, the electrical connector assembly 100 may include one or more RF absorbers, such as the RF absorbers described in US patent application 13/556,665, Titled Electrical Connector Assembly, the complete subject matter of which is herein incorporated by reference in its entirety. The RF absorbers may limit the amount of EMI leakage from the cage member 102 through the airflow openings 200. Other types of EMI reducing features may be incorporated in alternative embodiments, such as EMI screens that cover or extend over the airflow openings 200 but still allow a substantial amount of airflow through the channel 190.

Figure 4:
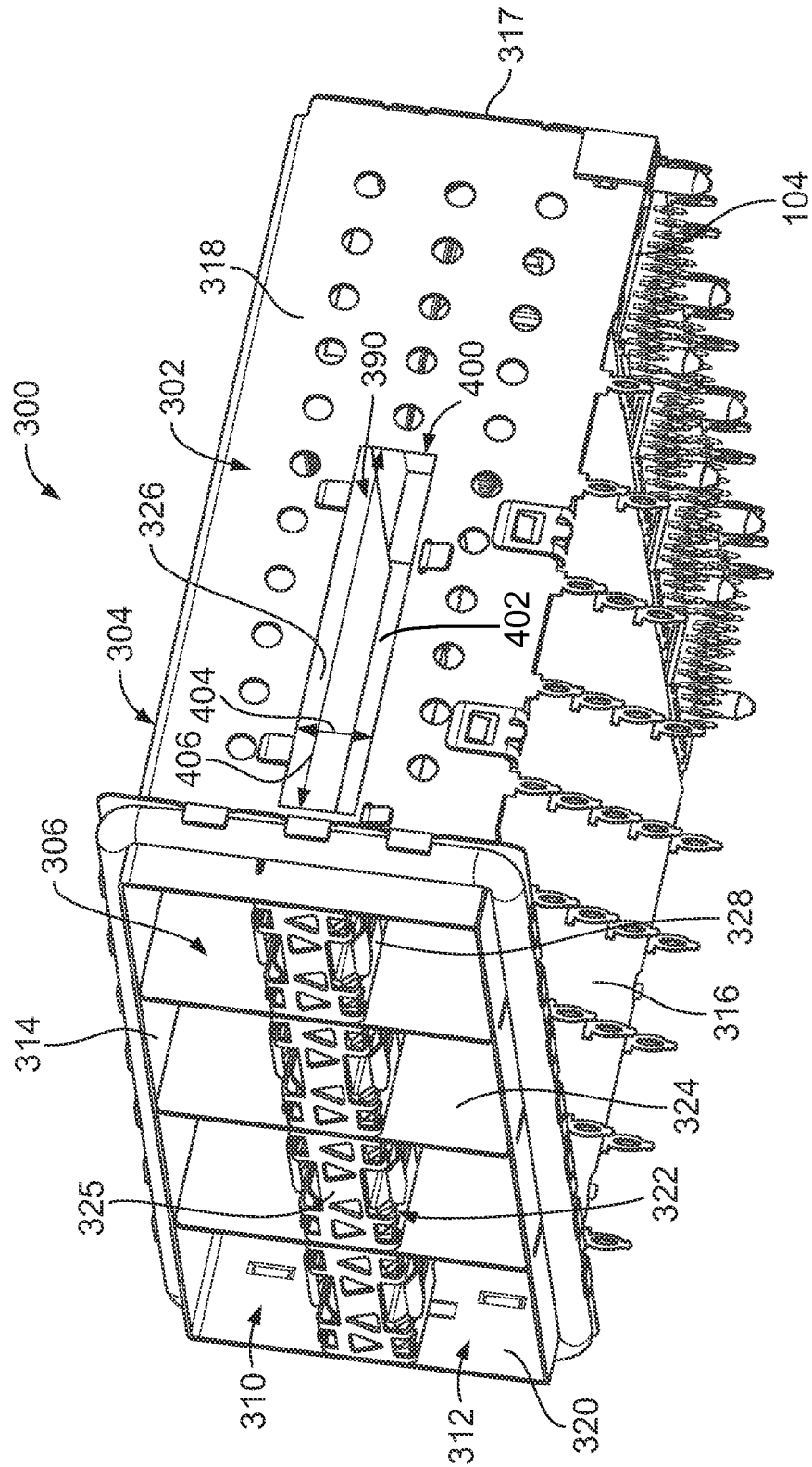
FIG. 4 is a front perspective view from an underside of an alternative electrical connector assembly showing a cage member and a plurality of receptacle connectors.

FIG. 4 is a front perspective view from an underside of an alternative electrical connector assembly 300 showing a cage member 302 and a plurality of the receptacle connectors 104. Pluggable modules 106 (shown in FIG. 9) are configured to be loaded into the cage member 302 for mating with the receptacle connector 104.

The cage member 302 is a shielded, stamped and formed cage member that includes a plurality of exterior shielded walls 304 and a plurality of interior shielded walls 306 defining the cage member 302. The cage member 302 differs from the cage member 102 (shown in FIG. 1) in that the cage member 302 includes more ports. The cage member 302 includes a plurality of upper ports 310 and a plurality of lower ports 312. While four columns of ports 310, 312 are shown, it is realized that any number of columns of ports may be provided in alternative embodiments.

The exterior shielded walls 304 includes a top wall 314, a lower wall 316, a rear wall 317 and side walls 318, 320, which together define the general enclosure for the cage member 302. The interior shielded walls 306 include separator members 322 between the rows of ports 310, 312 and divider walls 324 between the columns of ports 310, 312. The separator members 322 extend between one of the side walls 318, 320 and one of the divider walls 324 or between adjacent ones of the divider walls 324.

The separator member 322 has a front wall 325 with an upper plate 326 and a lower plate 328 extending rearward from the front wall 325. A channel 390 is defined between the upper and lower plates 326, 328 rearward of the front wall 325. The upper and lower plates 326, 328 are spaced apart from one another defining an air gap through the channel 390. In an exemplary embodiment, airflow openings 400 are provided in the side walls 318, 320 to provide access to the channels 390. Airflow openings 402 (also shown in FIG. 5) are provided in the divider walls 324 to provide access between the channels 390. The airflow openings 400, 402 are large openings in the side walls 318, 320 and divider walls 324 providing a large volume of air flow through the channels 390. In the illustrated embodiment, the airflow openings 400, 402 are substantially similar in size as the channel 390. For example, the airflow openings 400, 402 may have similar heights 404 and lengths 406 as the heights and lengths of the channels 390.

Figure 5:
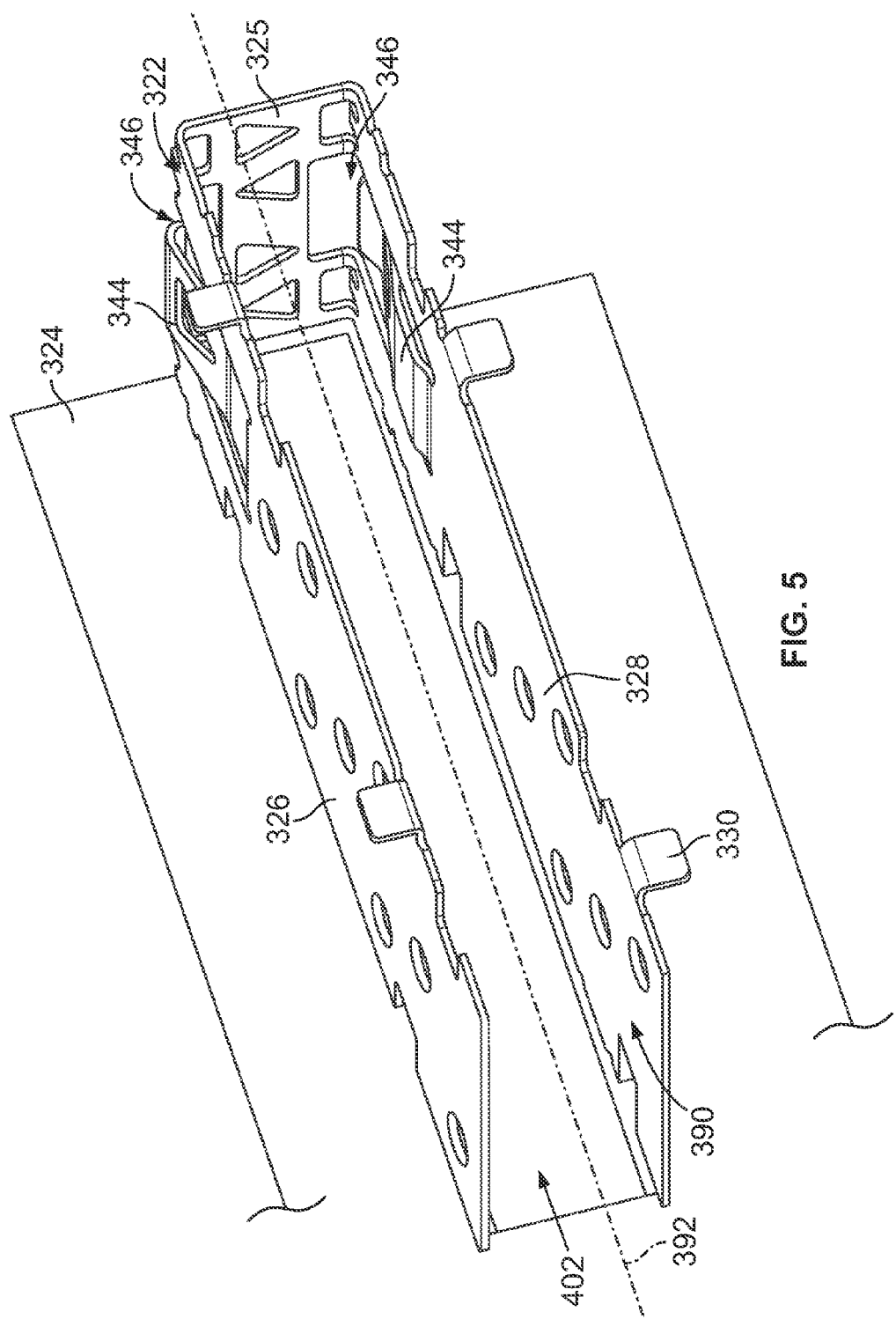
FIG. 5 is a perspective view of a separator member for the cage member shown in FIG. 1 and/or FIG. 4.

FIG. 5 is a perspective view of one of the separator members 322 coupled to one of the divider walls 324. The airflow opening 402 in the divider wall 324 is illustrated and is aligned with the channel 390. The separator member 322 is stamped and formed from a metal piece into a U-shaped structure. The separator member 322 includes tabs 330 extending from the upper and lower plates 326, 328 that are configured to engage the corresponding side walls 318, 320 or divider walls 324 (shown in FIG. 4).

The separator member 322 include latches 344 adjacent a front edge thereof for grounding the pluggable module 106 (shown in FIG. 9) and the cage member 302. Additionally, the latches 344 have latch openings 346 for latching engagement with the pluggable module 106. The latches 344 are deflectable and are stamped from the upper and lower plates 326, 328.

The channel 390 is elongated and extends along a longitudinal axis 392 between the open rear end and the front wall 325. The latches 344 may be at least partially deflected into the channel when the pluggable modules 106 are loaded into the ports 310, 312 (shown in FIG. 4). The channel 390 defines a space that allows the latches 344 and/or portions of the pluggable modules 106 to extend into during use. The upper and lower plates 326, 328 are spaced apart to accommodate the latches 344 and/or portions of the pluggable modules 106. Optionally, the electrical connector assembly 300 may include RF absorbers positioned within the channel 390 to reduce or even eliminate EMI leakage from the channel 390.

Figure 6:
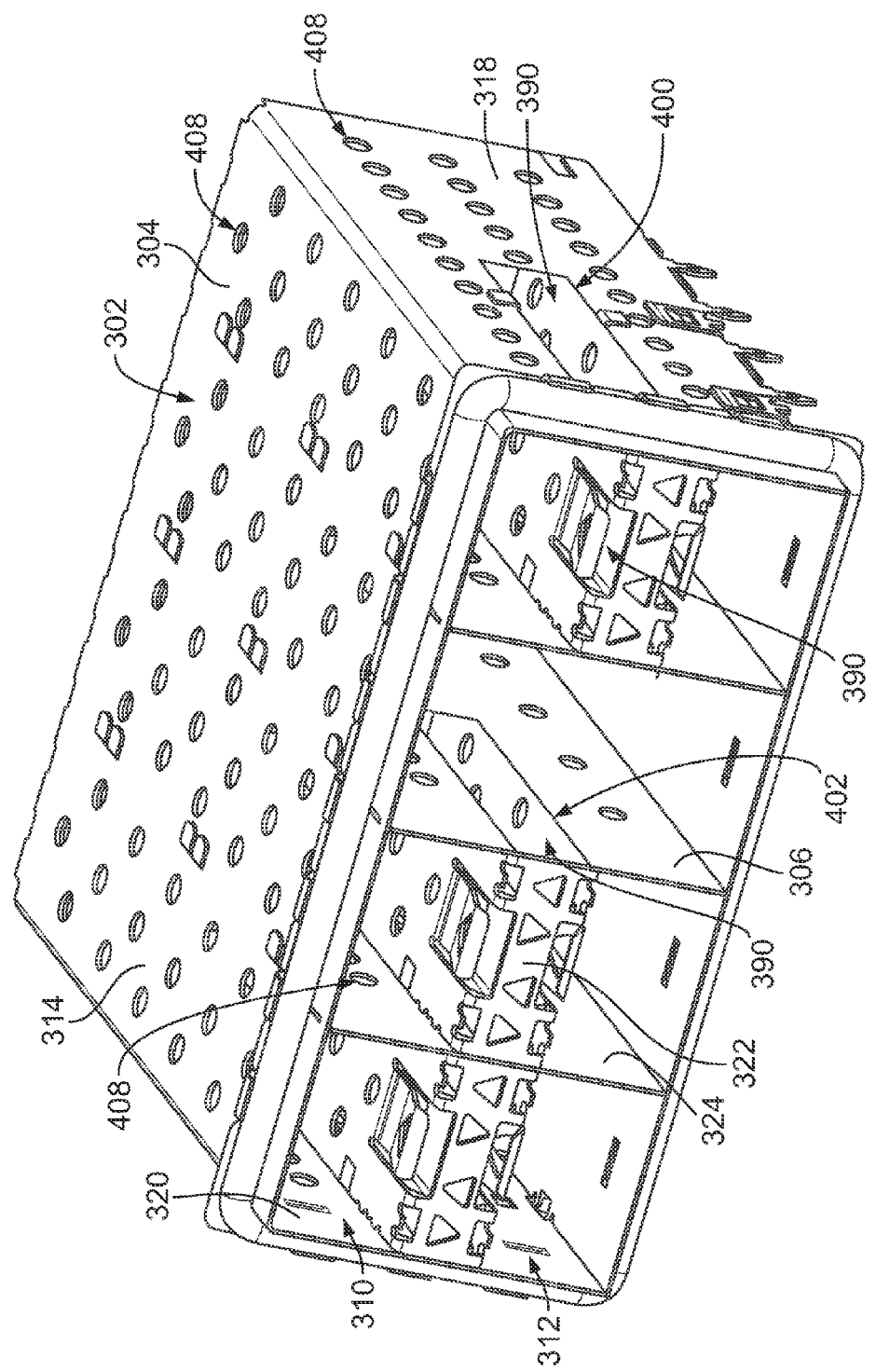
FIG. 6 is a front perspective view of the cage member shown in FIG. 4 less one of the separator members shown in FIG. 5.

FIG. 6 is a front perspective view of the cage member 302 less the receptacle connectors 104 (shown in FIG. 4). The separator members 322 are connected to the corresponding walls 318, 320, 324. One of the separator members 322 has been removed for clarity. The airflow openings 400, 402 are aligned with one another and with the channels 390 to define an airflow path through the cage member 302. In an exemplary embodiment, an air mover, such as a fan, may be provided in the vicinity of the electrical connector assembly 300 to force air flow through the electrical connector assembly 300. The air flow may be directed in a direction parallel to the top walls 314 and generally perpendicular to the side walls 318, 320. The air flow is directed generally through the airflow openings 400, 402 through the channels 390 to dissipate heat and cool the pluggable modules 106 (shown in FIG. 9). Some air flow may be directed through low airflow openings 408 in the walls 304, but a much larger volume of air flow is directed through the airflow openings 400, 402 through the channels 390.

The separator members 322 are electrically connected to the other walls 306 to provide shielding between the upper and lower ports 310, 312. Light pipe structures 196 (shown in FIG. 3) may be held within the channels 390. RF absorbers may reduce EMI leakage from the separator members 322 by absorbing energy propagated down the channels 390.

Figure 7:
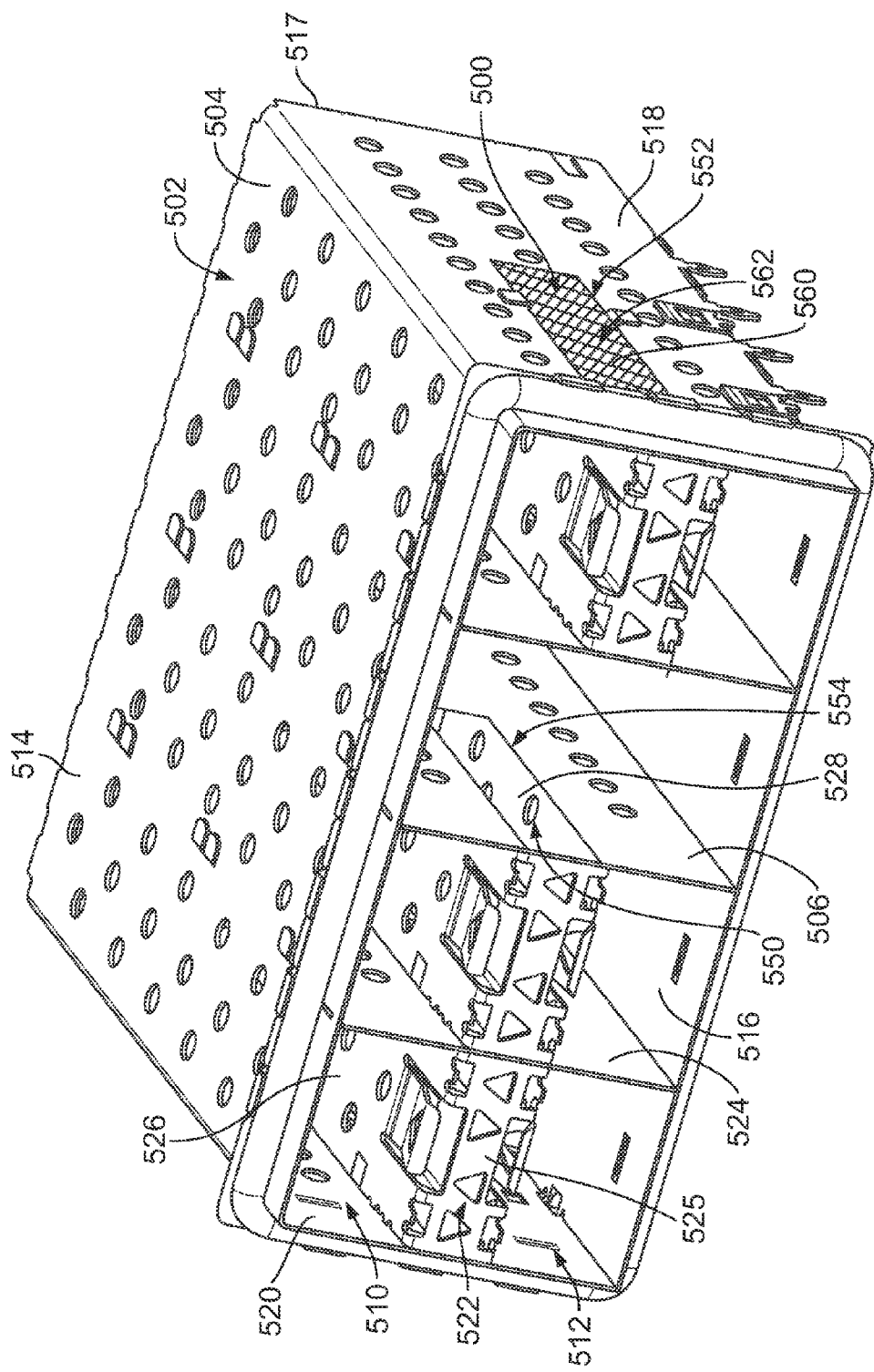
FIG. 7 is a front perspective view of an alternative cage member formed in accordance with an exemplary embodiment.

FIG. 7 is a front perspective view of an alternative cage member 502 formed in accordance with an exemplary embodiment. The cage member 502 is similar to the cage member 302, however the cage member 502 includes an EMI screen 500. Pluggable modules 106 (shown in FIG. 9) are configured to be loaded into the cage member 502 for mating with a receptacle connector 104 (shown in FIG. 2).

The cage member 502 is a shielded, stamped and formed cage member that includes a plurality of exterior shielded walls 504 and a plurality of interior shielded walls 506 defining the cage member 502. The cage member 502 includes a plurality of upper ports 510 and a plurality of lower ports 512. While four columns of ports 510, 512 are shown, it is realized that any number of columns of ports may be provided in alternative embodiments.

The exterior shielded walls 504 includes a top wall 514, a lower wall 516, a rear wall 517 and side walls 518, 520, which together define the general enclosure for the cage member 502. The interior shielded walls 506 include separator members 522 between the rows of ports 510, 512 and divider walls 524 between the columns of ports 510, 512. One of the interior separator members 522 has been removed for clarity to illustrate the divider wall 524. The separator members 522 extend between one of the side walls 518, 520 and one of the divider walls 524 or between adjacent ones of the divider walls 524.

Each separator member 522 has a front wall 525 with an upper plate 526 and a lower plate 528 extending rearward from the front wall 525. A channel 550 is defined between the upper and lower plates 526, 528 rearward of the front wall 525. The upper and lower plates 526, 528 are spaced apart from one another defining an air gap through the channel 550. In an exemplary embodiment, airflow openings 552 are provided in the side walls 518, 520 to provide access to the channels 550. Airflow openings 554 are provided in the divider walls 524 to provide access between the channels 550. The airflow openings 552, 554 are large openings in the side walls 518, 520 and divider walls 524 providing a large volume of air flow through the channels 550. In the illustrated embodiment, the airflow openings 552, 554 are substantially similar in size as the channel 550. For example, the airflow openings 552, 554 may have similar heights and lengths as the heights and lengths of the channels 550.

In an exemplary embodiment, the EMI screens 500 extend over the airflow openings 552 in the side walls 518, 520. The EMI screens 500 are separately provided from, and coupled to, the side walls 518, 520. The EMI screens 500 are discrete from the side walls 518, 520, and may be manufactured from a metal material to provide EMI shielding at the airflow openings 552. The EMI screens 500 may be coupled to the inside or the outside of the side walls 518, 520. The EMI screens 500 may be coupled to the side walls 518, 520 using securing means, such as solder, adhesive, epoxy, fasteners, and the like. Optionally, the side walls 518, 520 may include tabs extending therefrom that are used to secure the EMI screens 500 in place, such as by bending the tabs against the EMI screens 500 to capture the EMI screens 500. The side walls 518, 520 may include slots that receive the EMI screens 500 to hold the EMI screens 500.

Each EMI screen 500 includes a grid 560 having a plurality of discrete apertures 562 that direct the airflow through the airflow opening 552. The grid 560 includes a plurality of metal frame members that intersect or cross each other.

The airflow openings 552, 554 are aligned with one another and with the channels 550 to define an airflow path through the cage member 502. In an exemplary embodiment, an air mover, such as a fan, may be provided in the vicinity of the cage member 502 to force air flow through airflow openings 552, 554 through the channels 550 to dissipate heat and cool the pluggable modules 106 (shown in FIG. 9).

Figure 8:
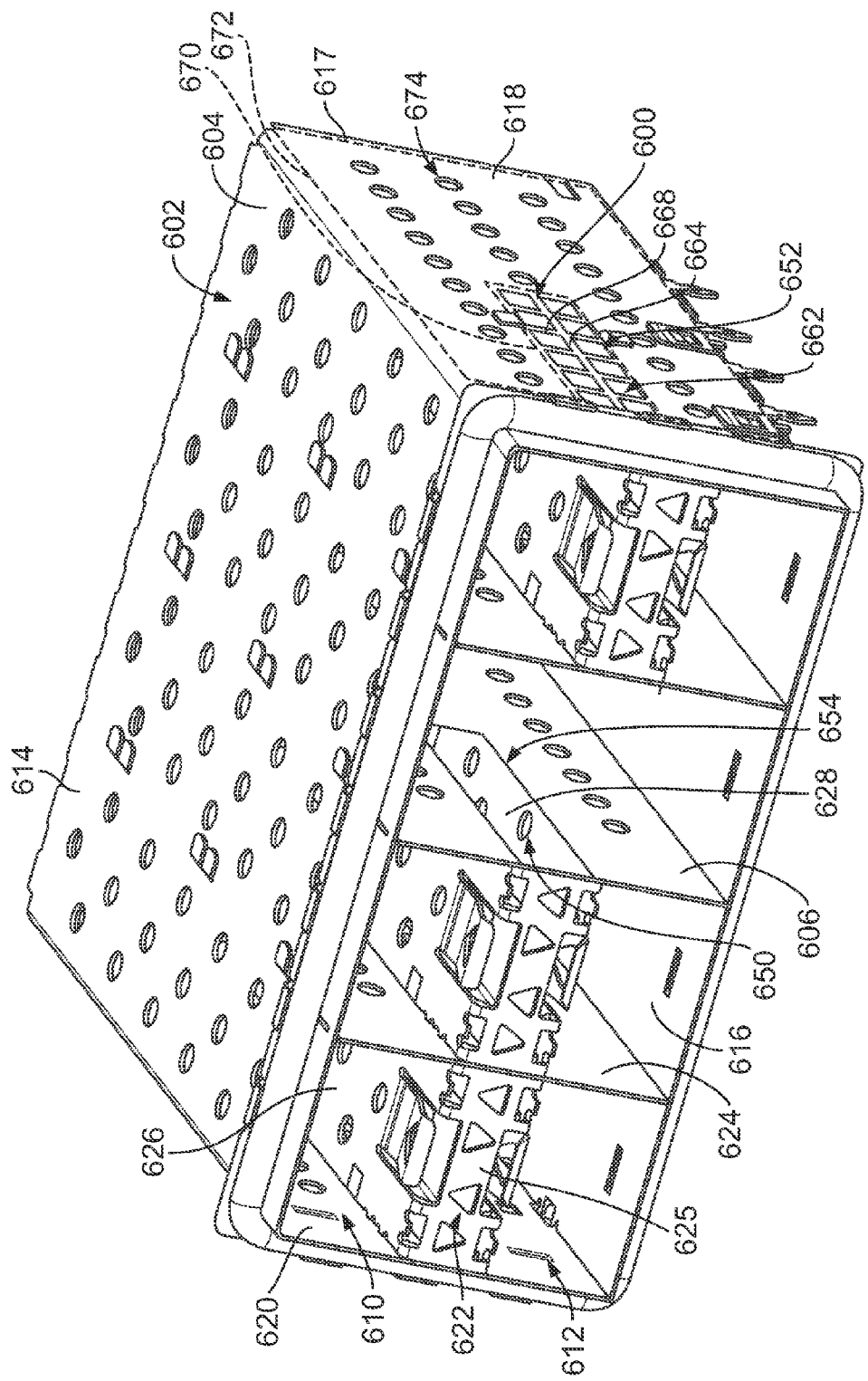
FIG. 8 is a front perspective view of another alternative cage member formed in accordance with an exemplary embodiment.

FIG. 8 is a front perspective view of another alternative cage member 602 formed in accordance with an exemplary embodiment. The cage member 602 is similar to the cage member 302, however the cage member 602 includes an EMI screen 600. Pluggable modules 106 (shown in FIG. 9) are configured to be loaded into the cage member 602 for mating with a receptacle connector 104 (shown in FIG. 2).

The cage member 602 is a shielded, stamped and formed cage member that includes a plurality of exterior shielded walls 604 and a plurality of interior shielded walls 606 defining the cage member 602. The cage member 602 includes a plurality of upper ports 610 and a plurality of lower ports 612. While four columns of ports 610, 612 are shown, it is realized that any number of columns of ports may be provided in alternative embodiments.

The exterior shielded walls 604 include a top wall 614, a lower wall 616, a rear wall 617 and side walls 618, 620, which together define the general enclosure for the cage member 602. The interior shielded walls 606 include separator members 622 between the rows of ports 610, 612 and divider walls 624 between the columns of ports 610, 612. One of the interior separator members 622 has been removed for clarity to illustrate the divider wall 624. The separator members 622 extend between one of the side walls 618, 620 and one of the divider walls 624 or between adjacent ones of the divider walls 624.

Each separator member 622 has a front wall 625 with an upper plate 626 and a lower plate 628 extending rearward from the front wall 625. A channel 650 is defined between the upper and lower plates 626, 628 rearward of the front wall 625. The upper and lower plates 626, 628 are spaced apart from one another defining an air gap through the channel 650. In an exemplary embodiment, airflow openings 652 are provided in the side walls 618, 620 to provide access to the channels 650. Airflow openings 654 are provided in the divider walls 624 to provide access between the channels 650. The airflow openings 652, 654 are large openings in the side walls 618, 620 and divider walls 624 providing a large volume of air flow through the channels 650. In the illustrated embodiment, the airflow openings 652, 654 are substantially similar in size as the channel 650. For example, the airflow openings 652, 654 may have similar heights and lengths as the heights and lengths of the channels 650.

In an exemplary embodiment, the EMI screens 600 extend over the airflow openings 652 in the side walls 618, 620. The EMI screens 600 are integrally formed with the side walls 618, 620. The EMI screens 600 are stamped from the side walls 618, 620 during a manufacturing process of the cage member 602. Each EMI screen 600 includes a grid dividing the airflow opening 652 into a plurality of discrete apertures 662 that direct the airflow through the airflow opening 652. In the illustrated embodiment, the grid includes one or more longitudinal arms 664 and a plurality of lateral arms 668 extending between the longitudinal arm 664 and the side wall

618, 620. In the illustrated embodiment, the apertures 662 are square or rectangular in shape defined by the lateral and longitudinal arms 668, 664. The grid may include other metal strips or parts that form other shaped openings in alternative embodiments, such as circular, oval, diamond or other shapes. The size, shape, number of openings, positioning of the openings, spacing between the openings or other variable parameters may be tuned (i.e. selected to prevent EMI at certain frequencies). The EMI shielding may be tuned by varying one or more of the parameters. The parameters may be selected to optimize the EMI shielding while maximizing airflow through the exterior shielded walls 604.

The side walls 618, 620 include a high airflow area 670 and a low airflow area 672. The high airflow area 670 is defined at the airflow opening 652. The high airflow area 670 has a low wall density and a high void density. In other words, the high airflow area 670 has more voids or openings than area of wall material. In contrast, the low airflow area 672 is defined elsewhere on the side wall 618, 620 surrounding the airflow opening 652. The low airflow area 672 has a high wall density and a low void density. In other words, the low airflow area 672 has more wall material than area of voids or openings. The low airflow area 672 may include a plurality of low airflow openings 674. The low airflow openings 674 are arranged in a less dense, or more spread out configuration than the apertures 662. Optionally, the low airflow openings 674 may be smaller in size than the apertures 662. Optionally, low airflow openings 674 may be spread further apart than the apertures 662. More wall material is provided between the low airflow openings 674 than the apertures 662.

The airflow openings 652, 654 are aligned with one another and with the channels 650 to define an airflow path through the cage member 602. In an exemplary embodiment, an air mover, such as a fan, may be provided in the vicinity of the cage member 602 to force air flow through airflow openings 652, 654 through the channels 650 to dissipate heat and cool the pluggable modules 106 (shown in FIG. 9).

Figure 9:
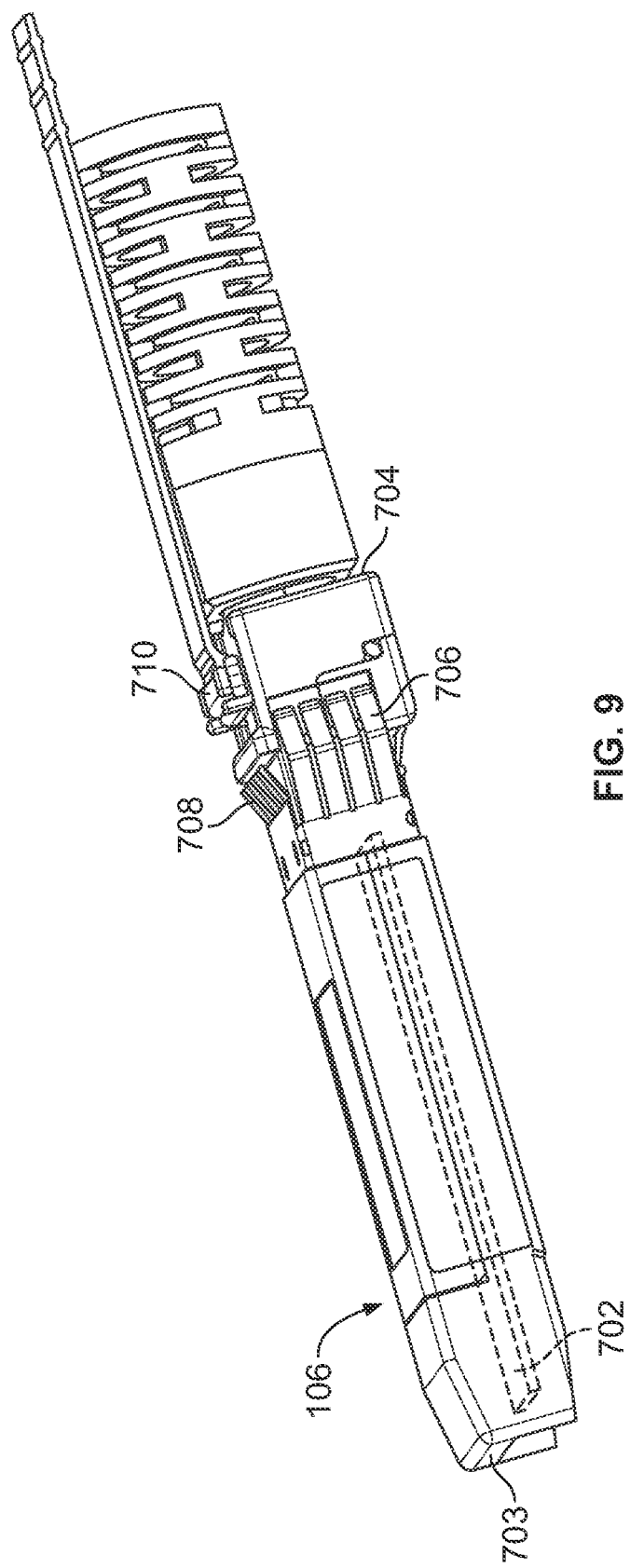
FIG. 9 is a perspective view of a pluggable module for receipt within the cage members and for interconnection with the receptacle connectors.

FIG. 9 illustrates a pluggable module 106 for use with electrical connector assemblies, such as the electrical connector assemblies 100, 300 (shown in FIGS. 1 and 4). In the illustrated embodiment, the pluggable module 106 constitutes a small form-factor pluggable (SFP) module having a circuit card 702 at a mating end 703 thereof for interconnection into the slots 180, 182 (shown in FIG. 2) and into interconnection with the contacts 184 or 186 therein. The pluggable module 106 would further include an electrical interconnection within the module to an interface at end 704, such as a copper interface in the way of a modular jack, or to a fiber optic connector for further interfacing. The pluggable module 106 would also include grounding tabs 706, 708, and a raised embossment 710. The embossment 710 would latch into the triangular shaped opening of the latch 144 (shown in FIG. 1). This allows for easy extraction of the pluggable module 106 as the latches 144 are accessible from the front end of the corresponding cage member 102. Other types of pluggable modules or transceivers may be utilized in alternative embodiments.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein."Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. An electrical connector assembly comprising:
   a shielding cage member having a plurality of walls including a top wall, a lower wall, a rear wall and side walls, the walls defining an upper port and a lower port configured to receive pluggable modules therein, the cage member having openings in a front thereof for receiving the pluggable modules;
   a separator member extends between the upper and lower ports, the separator member has an upper plate and a lower plate with a channel therebetween; and
   a receptacle connector received in the cage member proximate to a rear thereof, the receptacle connector being accessible through the upper port and the lower port;
   wherein the side walls include airflow openings on opposite sides of the cage member, each of the airflow openings being sized substantially similar to a size of the channel and being aligned with the channel, the airflow openings providing airflow through the channel.

2. The electrical connector assembly of claim 1, wherein the channel is open sided to allow airflow through the channel along the upper plate and the lower plate.

3. The electrical connector assembly of claim 1, wherein the airflow openings have a height substantially equal to a height of the channel.

4. The electrical connector assembly of claim 1, wherein the airflow openings have a length substantially equal to a length of the channel.

5. The electrical connector assembly of claim 1, wherein the airflow openings each have a length measured between a front edge and a rear edge, the length being at least half a length of the cage member measured between the front and the rear wall.

6. The electrical connector assembly of claim 1, wherein the airflow openings have an upper edge and a lower edge, the upper edges being substantially aligned with the upper plate, the lower edges being substantially aligned with the lower plate.

7. The electrical connector assembly of claim 1, wherein the cage member has a plurality of upper ports and a plurality of lower ports, separator members being positioned between corresponding upper ports and lower ports, the cage member having a dividing wall separating interior sides of the upper ports and lower ports, the dividing wall having an airflow opening aligned with the separator members and the airflow openings in the side walls.

8. The electrical connector assembly of claim 1, further comprising EMI screens covering the airflow openings.

9. An electrical connector assembly comprising:
a shielding cage member having a plurality of walls including a top wall, a lower wall, a rear wall and side walls, the walls defining an upper port and a lower port configured to receive pluggable modules therein, the cage member having openings in a front thereof for receiving the pluggable modules, wherein the side walls include airflow openings on opposite sides of the cage member;
a receptacle connector received in the cage member proximate to the rear, the receptacle connector being accessible through the upper port and the lower port;
a separator member extends between the upper and lower ports, the separator member has an upper plate and a lower plate with a channel therebetween, the airflow openings being aligned with the channel and providing airflow through the channel; and
EMI screens covering the airflow openings to limit EMI passage through the airflow openings.

10. The electrical connector assembly of claim 9, wherein the EMI screens are integrally formed with the side walls.

11. The electrical connector assembly of claim 9, wherein the EMI screens are metal and include a plurality of apertures, the apertures allowing airflow through the airflow openings.

12. The electrical connector assembly of claim 9, wherein the EMI screens are separately provided from and coupled to corresponding side walls.

13. The electrical connector assembly of claim 9, wherein the EMI screens have a plurality of apertures, the size, shape, number and positioning of the apertures being selected to prevent EMI at certain frequencies.

14. The electrical connector assembly of claim 9, wherein the EMI screen covers less than half of the area of the corresponding airflow opening.

15. The electrical connector assembly of claim 9, wherein the cage member has a plurality of upper ports and a plurality of lower ports, separator members being positioned between corresponding upper ports and lower ports, the cage member having dividing walls separating the upper ports and lower ports, the dividing walls having airflow openings aligned with the channels and the airflow openings in the side walls.

16. An electrical connector assembly comprising:
a shielding cage member having an upper port and a lower port configured to receive pluggable modules therein, the cage member having a front mating face having openings receiving the pluggable modules, the cage member having outer side walls along the sides of the upper and lower ports and a separator member extending between the upper and lower ports, the separator member having an upper plate and a lower plate with a channel therebetween, the outer side walls having airflow openings on opposite sides of the cage member, each of the airflow openings being sized substantially similar to a size of the channel and being aligned with the channel, the airflow openings providing airflow through the channel.

17. The electrical connector assembly of claim 16, wherein the channel is open sided to allow airflow through the channel along the upper plate and the lower plate.

18. The electrical connector assembly of claim 16, further comprising EMI screens extending along the airflow openings, the EMI screens having grids covering less than half of the airflow openings and apertures covering more than half of the airflow openings.

19. The electrical connector assembly of claim 16, wherein the cage member has a plurality of upper ports and a plurality of lower ports, separator members being positioned between corresponding upper ports and lower ports, the cage member having dividing walls separating the upper ports and lower ports, the dividing walls having airflow openings aligned with the channels and the airflow openings in the side walls.

20. The electrical connector assembly of claim 16, wherein the airflow openings have a height substantially equal to a height of the channel, and the airflow openings have a length substantially equal to a length of the channel.

\* \* \* \* \*